(12) United States Patent
Kishimura et al.

(10) Patent No.: US 6,475,706 B1
(45) Date of Patent: Nov. 5, 2002

(54) PATTERN FORMATION METHOD

(75) Inventors: Shinji Kishimura, Hyogo; Akiko Katsuyama, Kyoto; Masaru Sasago, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/523,664

(22) Filed: Mar. 10, 2000

(30) Foreign Application Priority Data

Mar. 12, 1999 (JP) .......................................... 11-066232

(51) Int. Cl.[7] .............................. G03F 7/30; G03F 7/004
(52) U.S. Cl. ..................... 430/325; 430/270.1; 430/326; 430/905
(58) Field of Search ................................ 430/325, 326, 430/270.1, 905

(56) References Cited

U.S. PATENT DOCUMENTS

| | | | |
|---|---|---|---|
| 4,678,737 A | | 7/1987 | Schneller et al. |
| 5,324,804 A | | 6/1994 | Steinmann |
| 5,558,978 A | | 9/1996 | Schädeli et al. |
| 5,658,706 A | * | 8/1997 | Niki et al. ............... 430/270.1 |
| 5,824,451 A | * | 10/1998 | Aoai et al. ............... 430/270.1 |
| 6,013,411 A | * | 1/2000 | Aoai et al. ............... 430/270.1 |
| 6,054,254 A | * | 4/2000 | Sato et al. ................ 430/322 |
| 6,162,577 A | * | 12/2000 | Felter et al. ............. 430/270.1 |

FOREIGN PATENT DOCUMENTS

| | | |
|---|---|---|
| JP | 60-205444 | 10/1985 |
| JP | 03-083063 | 4/1991 |
| JP | 06-035186 | 2/1994 |
| JP | 06-084784 | 3/1994 |
| JP | 06-095389 | 4/1994 |
| JP | 06-100488 | 4/1994 |
| JP | 06-161112 | 6/1994 |
| JP | 07-181677 | 7/1995 |
| JP | 07-206939 | 8/1995 |
| JP | 08-015862 | 1/1996 |
| JP | 08-146599 | 6/1996 |
| JP | 08-181052 | 7/1996 |
| JP | 08-337616 | 12/1996 |
| JP | 10-115928 | 5/1998 |
| JP | 10-306120 | 11/1998 |

* cited by examiner

*Primary Examiner*—John S. Chu
(74) *Attorney, Agent, or Firm*—Nixon Peabody LLP; Donald R. Studebaker

(57) ABSTRACT

A resist film is formed by applying, on a semiconductor substrate, a resist material containing a base polymer including polystyrene in which hydroxyl groups are substituted for hydrogen atoms at two or more portions of a benzene ring. The resist film is irradiated with exposing light of a wavelength of a 1 nm through 180 nm band through a mask for pattern exposure, and the resist film is developed after the pattern exposure, thereby forming a resist pattern.

10 Claims, 6 Drawing Sheets

US 6,475,706 B1

PATTERN FORMATION METHOD

BACKGROUND OF THE INVENTION

The present invention relates to a pattern formation method, and more particularly, it relates to a method of forming a resist pattern, used for forming a semiconductor device or a semiconductor integrated circuit on a semiconductor substrate, by using exposing light of a wavelength of a 1 nm through 180 nm band.

Currently, in fabrication of a large capacity semiconductor integrated circuit, typically such as a 64 Mbit dynamic random access memory (DRAM), a logic device or a system LSI with a 0.25 $\mu$m through 0.18 $\mu$m rule, a resist pattern is formed by using a resist material including a polyhydroxystyrene derivative as a main component and exposing light of KrF excimer laser (with a wavelength of a 248 nm band).

Moreover, in a pattern formation method under development for a 256 Mbit DRAM, a 1 Gbit DRAM or a system LSI with a 0.15 $\mu$m through 0.13 $\mu$m rule, ArF excimer laser operating at a shorter wavelength (of a 193 nm band) than the KrF excimer laser is to be used as the exposing light.

A resist material including a polyhydroxystyrene derivative as a main component includes an aromatic ring having a high absorbing property against light of a wavelength of a 193 nm band. Therefore, the exposing light of a wavelength of a 193 nm band cannot uniformly reach the bottom of a resist film made from this resist material, and hence, a good pattern shape cannot be obtained with this exposing light. Accordingly, the resist material including a polyhydroxystyrene derivative as a main component cannot be used when the ArF excimer laser is used as the exposing light.

Therefore, when the ArF excimer laser is used as the exposing light, a material including, as a main component, a polyacrylic acid derivative free from an aromatic ring is used as a resist material.

On the other hand, X-rays and electron beams (EB) are now examined to be used as exposing light adopted in a pattern formation method applicable to higher resolution.

When X-rays are used as the exposing light, however, there arise various problems in an aligner and formation of amask. Also, when EB is used as the exposing light, there arises a problem of throughput, and hence, EB is not suitable to mass production. Thus, X-rays and EB are not preferred as the exposing light.

Accordingly, in order to form a resist pattern finer than 0.13 $\mu$m, it is necessary to use, as the exposing light, a laser beam with a wavelength shorter than that of the ArF excimer laser, such as a Xe$_2$ laser beam (with a wavelength of a 172 nm band), a F$_2$ laser beam (with a wavelength of a 157 nm band), a Kr$_2$ laser beam (with a wavelength of a 146 nm band), an ArKr laser beam (with a wavelength of a 134 nm band), an Ar$_2$ laser beam (with a wavelength of a 126 nm band) or a soft X-ray beam (with a wavelength of a 13, 11 or 5 nm band).

Therefore, the present inventors have formed a resist pattern from a resist film of a known resist material through pattern exposure using a F$_2$ laser beam.

However, the resultant resist pattern does not have a rectangular sectional shape but has a defective pattern shape.

SUMMARY OF THE INVENTION

In consideration of the aforementioned conventional problems, an object of the invention is forming a resist pattern in a good pattern shape by using light of a wavelength of a 1 nm through 180 nm band as exposing light.

The present inventors have concluded that the resist pattern has a defective pattern shape because the resist film has a high absorbing property against light of a wavelength of a 1 nm through 180 nm band, and variously studied about resist materials for decreasing the absorbing property against light of a wavelength of a 1 nm through 180 nm band. As a result, it has been found that the peak of a light absorption wavelength determined by a benzene ring is shifted toward a longer wavelength when a hydroxyl group is substituted for a hydrogen atom of the benzene ring, and that as the number of hydroxyl groups substituted for hydrogen atoms of the benzene ring is larger, the peak of the light absorption wavelength is more largely shifted toward a longer wavelength.

FIG. 1 is a diagram of transmittance curves of resist films each with a thickness of 0.1 $\mu$m for explaining that as the number of hydroxyl groups substituted for hydrogen atoms of a benzene ring is larger, the peak of a light absorption wavelength is more largely shifted toward a longer wavelength. In FIG. 1, a curve A corresponds to the transmittance curve of a resist film including polystyrene (wherein the number of substituted hydroxyl groups is 0), a curve B corresponds to that of a resist film including poly(p-hydroxystyrene) (wherein the number of substituted hydroxyl groups is 1), a curve C corresponds to that of a resist film including poly(m,p-dihydroxystyrene) (wherein the number of substituted hydroxyl groups is 2), and a curve D corresponds to that of a resist film including poly(m,m,p-trihydroxystyrene) (wherein the number of substituted hydroxyl groups is 3).

As is obvious from FIG. 1, as the number of hydroxyl groups bonded to a benzene ring is larger, the peak of the light absorption wavelength is more largely shifted toward a longer wavelength.

The present invention was devised on the basis of these findings. Specifically, the first pattern formation method of this invention comprises the steps of forming a resist film by applying, on a substrate, a resist material containing a base polymer including polystyrene in which hydroxyl groups are substituted for hydrogen atoms at two or more portions of a benzene ring; and forming a resist pattern by irradiating the resist film with light of a wavelength of a 1 nm through 180 nm band for pattern exposure and developing the resist film with a developer after the pattern exposure.

In the first pattern formation method, since the base polymer of the resist material includes polystyrene in which hydroxyl groups are substituted for hydrogen atoms at two or more portions of a benzene ring, the peak of a light absorption wavelength determined by the benzene ring is largely shifted toward a longer wavelength. Therefore, the absorbing property against light of a wavelength of a 1 nm through 180 nm band is decreased, and hence, transmittance against the exposing light of a wavelength of a 1 nm through 180 nm band is increased. As a result, a resist pattern can be formed in a good pattern shape through pattern exposure using light of a wavelength of a 1 nm through 180 nm band as the exposing light.

In the first pattern formation method, solubility of the base polymer in the developer preferably changes in the presence of an acid, and the resist material preferably further contains an acid generator for generating an acid through irradiation with the exposing light.

Thus, a resist pattern with higher sensitivity can be formed in a good pattern shape by using a chemically amplified resist.

In the first pattern formation method, the base polymer is preferably soluble in the developer, and the resist material preferably further contains a crosslinking agent for making the base polymer refractory in the developer by causing crosslinkage of the base polymer through irradiation with the exposing light.

Thus, a negative resist pattern can be formed in a good pattern shape.

In the first pattern formation method, the base polymer is preferably soluble in the developer, and the resist material preferably further contains a dissolution inhibiting agent that inhibits solubility of the base polymer in the developer and decomposes through irradiation with the exposing light.

Thus, a positive resist pattern can be formed in a good pattern shape.

In this case, the dissolution inhibiting agent is preferably a compound in which at least one of hydroxyl groups substituted for hydrogen atoms at two or more portions of a benzene ring of polystyrene is replaced with a protecting group.

Thus, the peak of the light absorption wavelength is further largely shifted toward a longer wavelength, and hence, the transmittance against the exposing light of a wavelength of a 1 nm through 180 nm band is further increased.

The second pattern formation method of this invention comprises the steps of forming a resist film by applying, on a substrate, a resist material containing a base polymer including polystyrene in which at least one of hydroxyl groups substituted for hydrogen atoms at two or more portions of a benzene ring is replaced with a protecting group; and forming a resist pattern by irradiating the resist film with exposing light of a wavelength of a 1 nm through 180 nm band for pattern exposure and developing the resist with a developer after the pattern exposure.

In the second pattern formation method, since the resist material contains the base polymer including polystyrene in which at least one of hydroxyl groups substituted for hydrogen atoms at two or more portions of a benzene ring is replaced with a protecting group, the peak of the light absorption wavelength determined by the benzene ring is largely shifted toward a longer wavelength. Therefore, the absorbing property against light of a wavelength of a 1 nm through 180 nm band is increased, and hence, the transmittance against the exposing light of a wavelength of a 1 nm through 180 nm band is increased. As a result, a resist pattern can be formed in a good pattern shape through pattern exposure using light of a wavelength of a 1 nm through 180 nm band as the exposing light.

In the second pattern formation method, solubility of the base polymer in the developer preferably changes in the presence of an acid, and the resist film preferably further contains an acid generator for generating an acid through irradiation with the exposing light.

Thus, a resist pattern with higher sensitivity can be formed in a good pattern shape by using a chemically amplified resist.

The third pattern formation method of this invention comprises the steps of forming a resist film by applying, on a substrate, a resist material containing a copolymer of a compound including polystyrene in which hydroxyl groups are substituted for hydrogen atoms at two or more portions of a benzene ring and a compound in which at least one of hydroxyl groups substituted for hydrogen atoms at two or more portions of a benzene ring is replaced with a protecting group; and forming a resist pattern by irradiating the resist film with exposing light of a wavelength of a 1 nm through 180 nm band for pattern exposure and developing the resist film with a developer after the pattern exposure.

In the third pattern formation method, since the base polymer of the resist material contains the copolymer of the compound including polystyrene in which hydroxyl groups are substituted for hydrogen atoms at two or more portions of a benzene ring and the compound in which at least one of hydroxyl groups substituted for hydrogen atoms at two or more portions of a benzene ring is replaced with a protecting group, the peak of the light absorption wavelength determined by the benzene rings is largely shifted toward a longer wavelength. Therefore, the absorbing property against light of a wavelength of a 1 nm through 180 nm band is decreased, and hence, the transmittance against the exposing light of a wavelength of a 1 nm through 180 nm band is increased. As a result, a resist pattern can be formed in a good pattern shape through pattern exposure using light of a wavelength of a 1 nm through 180 nm band as the exposing light.

In the third pattern formation method, solubility of the base polymer in the developer preferably changes in the presence of an acid, and the resist material preferably further contains an acid generator for generating an acid through irradiation with the exposing light.

Thus, a resist pattern with higher sensitivity can be formed in a good pattern shape by using a chemically amplified resist.

The fourth pattern formation method of this invention comprises the steps of forming a resist film by applying, on a substrate, a resist material containing a base polymer including polystyrene in which hydroxyl groups are substituted for hydrogen atoms at two or more portions of a benzene ring; irradiating the resist film with exposing light of a wavelength of a 1 nm through 180 nm band for pattern exposure and forming an organic metal film in a surface region of an unexposed portion of the resist film after the pattern exposure; and forming a resist pattern from the unexposed portion of the resist film by etching the resist film with the organic metal film used as a mask.

In the fourth pattern formation method, since the base polymer of the resist material includes polystyrene in which hydroxyl groups are substituted for hydrogen atoms at two or more portions of a benzene ring, the peak of the light absorption wavelength determined by the benzene ring is largely shifted toward a longer wavelength. Therefore, the absorbing property against light of a wavelength of a 1 nm through 180 nm band is decreased, and hence, the transmittance against the exposing light of a wavelength of a 1 nm through 180 nm band is increased. As a result, a resist pattern can be formed in a good pattern shape through pattern exposure using light of a wavelength of a 1 nm through 180 nm band as the exposing light.

Furthermore, in the fourth pattern formation method, since the concentration of the hydroxyl groups in the resist film is high, the organic metal film formed in the surface region of the unexposed portion of the resist film attains high density. This increases the etch selectivity between the exposed portion and the unexposed portion of the resist film. As a result, the resultant resist pattern can attain high resolution.

In any of the first through fourth pattern formation methods, the exposing light is preferably a $F_2$ laser beam or an $Ar_2$ laser beam.

DETAILED DESCRIPTION OF THE INVENTION

Embodiment 1

A pattern formation method of Embodiment 1 will now be described with reference to FIGS. 2(a) through 2(d).

In Embodiment 1, a positive pattern is formed by using a chemically amplified resist containing a base polymer including polystyrene in which hydroxyl groups are substituted for hydrogen atoms at two or more portions of abenzene ring; and an acid generator for generating an acid through irradiation with light. The specific composition of the resist material is as follows:

Base polymer:

a polymer represented by Chemical Formula 1 2 g

Acid generator: triphenylsulfonium triflate 0.04 g

Solvent: diglyme 20 g

Chemical Formula 1:

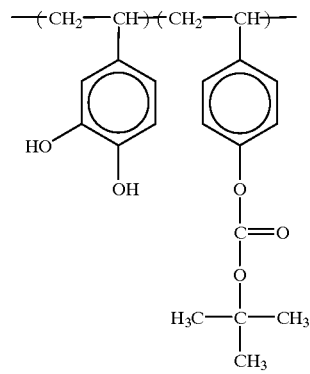

Figure 1:
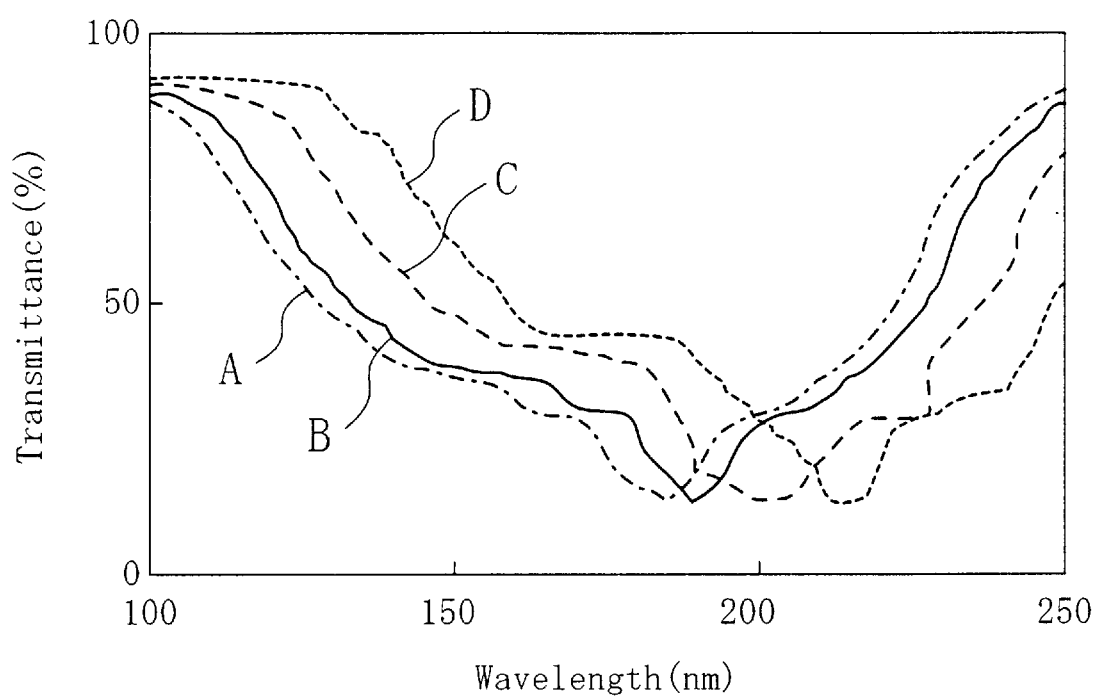
FIG. 1 shows transmittance curves for explaining that as the number of hydroxyl groups bonded to a benzene ring is larger, the peak of a light absorption wavelength is more largely shifted toward a longer wavelength.
Figure 2A:
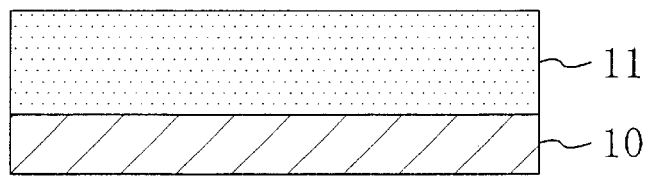
FIGS. 2(a) through 2(d) are sectional views for showing procedures in a pattern formation method of any of Embodiments 1, 3, 8 and 10 of the invention.

First, as is shown in FIG. 2(a), the resist material having the aforementioned composition is applied by spin coating on a semiconductor substrate 10, thereby forming a resist film 11 with a thickness of 0.3 µm.

Figure 2B:
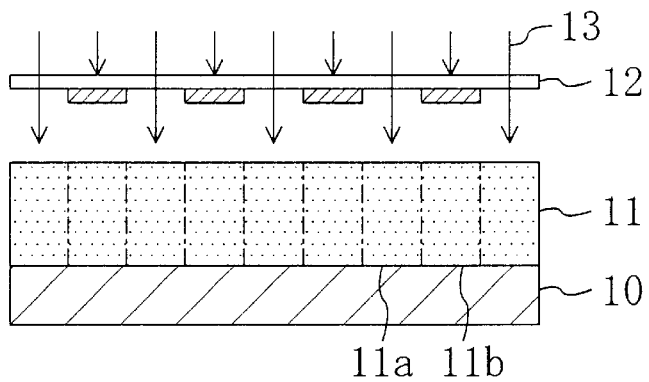

Next, as is shown in FIG. 2(b), the resist film 11 is irradiated with a $F_2$ laser beam 13 with a wavelength of a 157 nm band through a mask 12 for pattern exposure. In this manner, an acid is generated from the acid generator in an exposed portion 11a of the resist film 11 while no acid is generated in an unexposed portion 11b of the resist film 11.

Figure 2C:
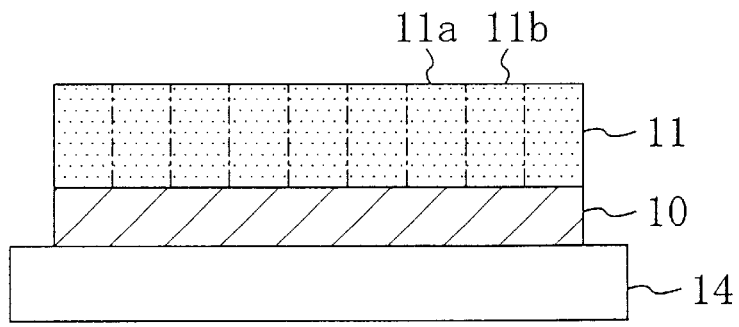

Then, as is shown in FIG. 2(c), the semiconductor substrate 10 together with the resist film 11 are heated with a hot plate 14. Although the base polymer is alkali-refractory, it decomposes when heated in the presence of an acid, and hence, the exposed portion 11a of the resist film 11 becomes soluble in an alkaline developer.

Figure 2D:
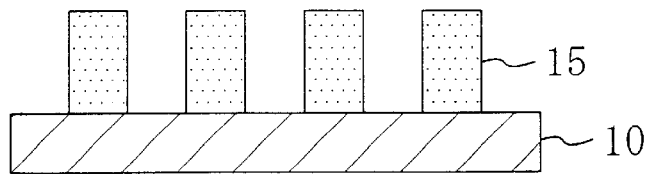

Thereafter, the resist film 11 is developed with an alkaline developer, such as a tetramethylammonium hydroxide aqueous solution. Since the exposed portion 11a of the resist film 11 is dissolved in the developer, the unexposed portion 11b of the resist film 11 is formed into a resist pattern 15 as is shown in FIG. 2(d).

In Embodiment 1, since the base polymer of the resist material includes polystyrene in which hydroxyl groups are substituted for hydrogen atoms at two or more portions of a benzene ring, the peak of the light absorption wavelength determined by the benzene ring is largely shifted toward a longer wavelength, and hence, the absorbing property against light of a wavelength of a 1 nm through 180 nm band is decreased. Accordingly, transmittance against the exposing light of a wavelength of a 1 nm through 180 nm band is increased. As a result, the exposing light can sufficiently reach the bottom of the resist film 11, and hence, the resist pattern 15 can be formed in a good sectional shape with a line width of 0.1 µm.

Embodiment 2

A pattern formation method of Embodiment 2 will now be described with reference to FIGS. 3(a) through 3(d).

In Embodiment 2, a negative pattern is formed by using a chemically amplified resist containing a base polymer including polystyrene in which hydroxyl groups are substituted for hydrogen atoms at two or more portions of a benzene ring; an acid generator for generating an acid through irradiation with light; and a crosslinking agent for causing crosslinkage of the base polymer when heated in the presence of an acid so as to make the base polymer refractory in an alkaline developer. The specific composition of the resist material is as follows:

Base polymer:
a polymer represented by Chemical Formula 2 2 g
Acid generator: triphenylsulfonium triflate 0.04 g
Crosslinking agent:
tri(N,N-dimethoxymethyl)melamine 0.6 g
Solvent: diglyme 20 g Chemical Formula 2:

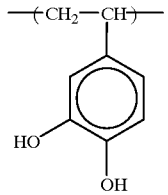

Figure 3A:
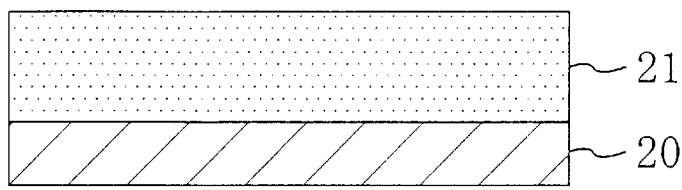
FIGS. 3(a) through 3(d) are sectional views for showing procedures in a pattern formation method of Embodiment 2 of the invention.

First, as is shown in FIG. 3(a), the resist material having the aforementioned composition is applied by spin coating on a semiconductor substrate 20, thereby forming a resist film 21 with a thickness of 0.3 µm.

Figure 3B:
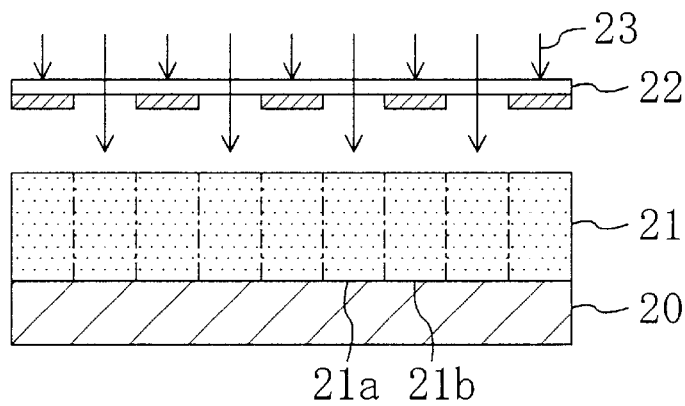

Next, as is shown in FIG. 3(b), the resist film 21 is irradiated with a $F_2$ laser beam 23 with a wavelength of a 157 nm band through a mask 22 for pattern exposure. In this manner, an acid is generated from the acid generator in an exposed portion 21a of the resist film 21 while no acid is generated in an unexposed portion 21b of the resist film 21.

Figure 3C:
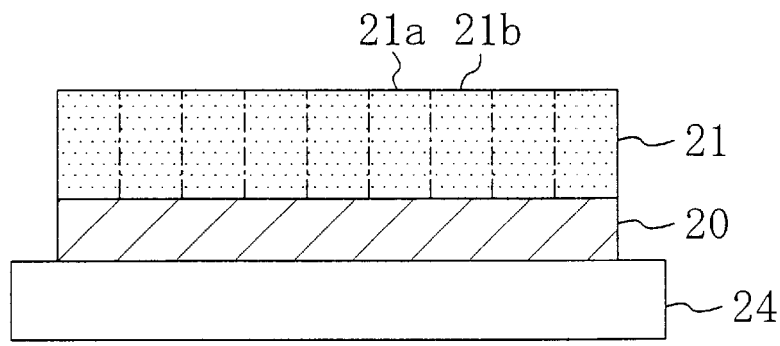

Then, as is shown in FIG. 3(c), the semiconductor substrate 20 is heated with a hot plate 24. Although the base polymer is soluble in an alkaline aqueous solution, it is crosslinked by the function of the crosslinking agent when heated in the presence of an acid, and hence, the exposed portion 21a of the resist film 21 becomes alkali-refractory.

Figure 3D:
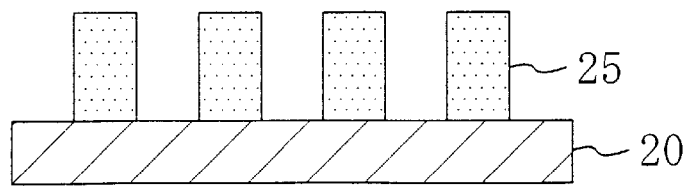

Thereafter, the resist film 21 is developed with an alkaline developer, such as a tetramethylammonium hydroxide aqueous solution. Since the unexposed portion 21b of the resist film 21 is dissolved in the developer, the exposed portion 21a of the resist film 21 is formed into a resist pattern 25 as is shown in FIG. 3(d).

In Embodiment 2, since the base polymer of the resist material includes polystyrene in which hydroxyl groups are substituted for hydrogen atoms at two or more portions of a benzene ring, the peak of the light absorption wavelength determined by the benzene ring is largely shifted toward a longer wavelength. Therefore, the absorbing property against light of a wavelength of a 1 nm through 180 nm band is decreased. Accordingly, transmittance against the exposing light of a wavelength of a 1 nm through 180 nm band is increased, and hence, the exposing light can sufficiently reach the bottom of the resist film 21. As a result, the resist pattern 25 can be formed in a good sectional shape with a line width of 0.1 µm.

Embodiment 3

A pattern formation method of Embodiment 3 will now be described with reference to FIGS. 2(a) through 2(d).

In Embodiment 3, a positive pattern is formed by using a chemically amplified resist containing a base polymer including polystyrene in which hydroxyl groups are substituted for hydrogen atoms at two or more portions of a benzene ring; an acid generator for generating an acid through irradiation with light; and a dissolution inhibiting agent, which decomposes when heated in the presence of an acid, for inhibiting solubility of the base polymer in an alkaline developer. The specific composition of the resist material is as follows:

Base polymer:
a polymer represented by Chemical Formula 3 2 g
Acid generator: triphenylsulfonium triflate 0.04 g
Dissolution inhibiting agent:
a compound represented by Chemical Formula 4 1.5 g
Solvent: diglyme 20 g Chemical Formula 3:

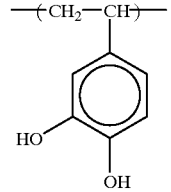

Chemical Formula 4:

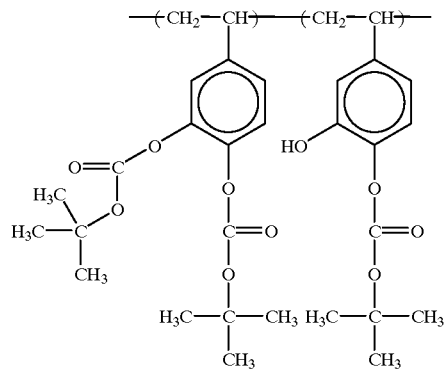

First, as is shown in FIG. 2(a), the resist material having the aforementioned composition is applied by spin coating on a semiconductor substrate 10, thereby forming a resist film 11 with a thickness of 0.3 µm.

Next, as is shown in FIG. 2(b), the resist film 11 is irradiated with a $F_2$ laser beam 13 with a wavelength of a 157 nm band through a mask 12 for pattern exposure. In this manner, an acid is generated from the acid generator in an exposed portion 11a of the resist film 11 while no acid is generated in an unexposed portion 11b of the resist film 11.

Although the base polymer is alkali-soluble, the resist film 11 is alkali-refractory due to the function of the dissolution inhibiting agent. Therefore, when the semiconductor substrate 10 is heated with a hot plate 14 as is shown in FIG. 2(c), the exposed portion 11a of the resist film 11 becomes soluble in an alkaline aqueous solution because the dissolution inhibiting agent decomposes when heated in the presence of an acid.

Thereafter, the resist film 11 is developed with an alkaline developer, such as a tetramethylammonium hydroxide aqueous solution. Since the exposed portion 11a of the resist film 11 is dissolved in the developer, the unexposed portion 11b of the resist film 11 is formed into a resist pattern 15 as is shown in FIG. 2(d).

In Embodiment 3, since the base polymer of the resist material includes polystyrene in which hydroxyl groups are substituted for hydrogen atoms at two or more portions of a benzene ring, the peak of the light absorption wavelength determined by the benzene ring is largely shifted toward a longer wavelength, and hence, the absorbing property against light of a wavelength of a 1 nm through 180 nm band is decreased. Accordingly, transmittance against the exposing light of a wavelength of a 1 nm through 180 nm band is increased. As a result, the exposing light can sufficiently reach the bottom of the resist film 11, and hence, the resist pattern 15 can be formed in a good sectional shape with a line width of 0.1 µm.

Embodiment 4

A pattern formation method of Embodiment 4 will now be described with reference to FIGS. 4(a) through 4(c).

In Embodiment 4, a positive pattern is formed by using a resist not chemically amplified (i.e.,ageneralresist) containing a base polymer including polystyrene in which hydroxyl groups are substituted for hydrogen atoms at two or more portions of a benzene ring. The specific composition of the resist material is as follows:

Base polymer:
a polymer represented by Chemical Formula 5 2 g
Solvent: diglyme 20 g Chemical Formula 5:

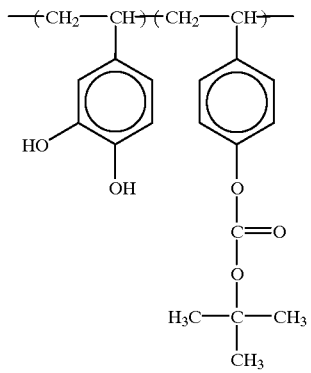

Figure 4A:
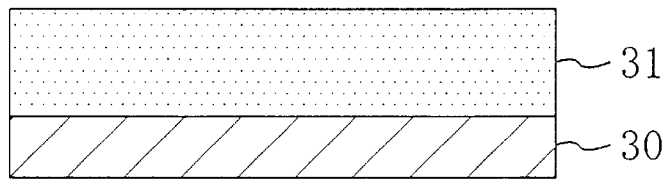
FIGS. 4(a) through 4(c) are sectional views for showing procedures in a pattern formation method of any of Embodiments 4, 6 and 9 of the invention.

First, as is shown in FIG. 4(a), the resist material having the aforementioned composition is applied by spin coating on a semiconductor substrate 30, thereby forming a resist film 31 with a thickness of 0.3 µm.

Figure 4B:
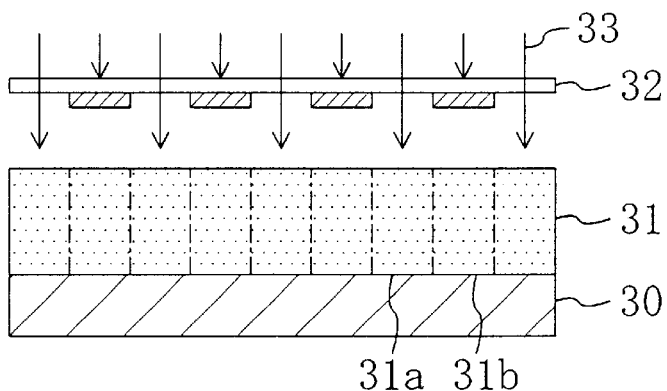
Figure 4C:
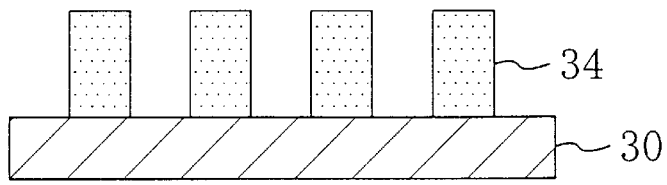

Next, as is shown in FIG. 4(b), the resist film 31 is irradiated with a $F_2$ laser beam 33 with a wavelength of a 157 nm band through a mask 32 for pattern exposure. In this manner, although the resist material is alkali-refractory, an exposed portion 31a of the resist film 31 becomes soluble in an alkaline aqueous solution through decomposition while an unexposed portion 31b of the resist film 31 remains alkali-refractory.

Then, the resist film 31 is developed with an alkaline developer. Since the exposed portion 31a of the resist film 31 is dissolved in the developer, the unexposed portion 31b of the resist film 31 is formed into a resist pattern 34 as is shown in FIG. 4(c).

In Embodiment 4, since the base polymer of the resist material includes polystyrene in which hydroxyl groups are substituted for hydrogen atoms at two or more portions of a benzene ring, the peak of the light absorption wavelength determined by the benzene ring is largely shifted toward a longer wavelength, and hence, the absorbing property against light of a wavelength of a 1 nm through 180 nm band is decreased. Accordingly, transmittance against the exposing light of a wavelength of a 1 nm through 180 nm band is increased. As a result, the exposing light can sufficiently reach the bottom of the resist film 31, and hence, the resist pattern 34 can be formed in a good sectional shape with a line width of 0.1 µm.

Emobodiment 5

A pattern formation method of Embodiment 5 will now be described with reference to FIGS. 5(a) through 5(c).

In Embodiment 5, a negative pattern is formed by using a resist not chemically amplified (i.e., ageneral resist) containing a base polymer including polystyrene in which hydroxyl groups are substituted for hydrogen atoms at two or more portions of a benzene ring; and a crosslinking agent for causing crosslinkage of the base polymer through irradiation with light so as to make the base polymer refractory in an alkaline developer. The specific composition of the resist material is as follows:

Base polymer:
a polymer represented by Chemical Formula 6 2 g
Crosslinking agent:
tri(N,N-dimethoxymethyl)melamine 0.6 g
Solvent: diglyme 20 g Chemical Formula 6:

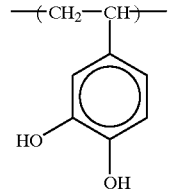

Figure 5A:
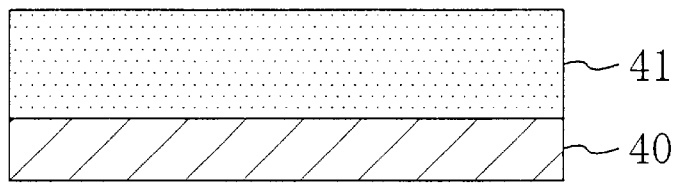
FIGS. 5(a) through 5(c) are sectional views for showing procedures in a pattern formation method of Embodiment 5 of the invention.

First, as is shown in FIG. 5(a), the resist material having the aforementioned composition is applied by spin coating on a semiconductor substrate 40, thereby forming a resist film 41 with a thickness of 0.3 µm.

Figure 5B:
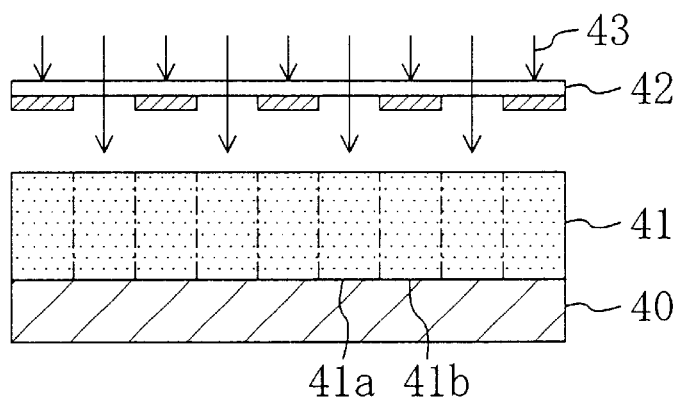
Figure 5C:
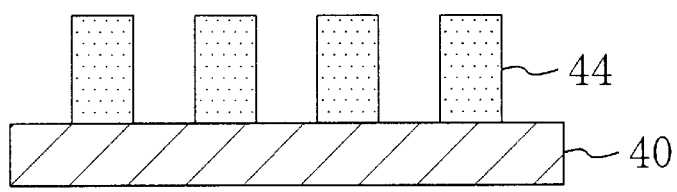

Next, as is shown in FIG. 5(b), the resist film 41 is irradiated with a $F_2$ laser beam 43 with a wavelength of a 157 nm band through a mask 42 for pattern exposure. Although the base polymer is soluble in an alkaline aqueous solution, it is crosslinked by the function of the crosslinking agent through irradiation with light, and hence, an exposed portion 41a of the resist film 41 becomes alkali-refractory.

Then, the resist film 41 is developed with an alkaline developer, such as a tetramethylammonium hydroxide aqueous solution. Since an unexposed portion 41b of the resist film 41 is dissolved in the developer, the exposed portion 41a of the resist film 41 is formed into a resist pattern 44 as is shown in FIG. 5(c).

In Embodiment 5, since the base polymer of the resist material includes polystyrene in which hydroxyl groups are substituted for hydrogen atoms at two or more portions of a benzene ring, the peak of the light absorption wavelength determined by the benzene ring is largely shifted toward a longer wavelength, and hence, the absorbing property against light of a wavelength of a 1 nm through 180 nm band is decreased. Accordingly, transmittance against the exposing light of a wavelength of a 1 nm through 180 nm band is increased. As a result, the exposing light can sufficiently reach the bottom of the resist film 41, and hence, the resist pattern 44 can be formed in a good sectional shape with a line width of 0.1 µm.

Embodiment 6

A pattern formation method of Embodiment 6 will now be described with reference to FIGS. 4(a) through 4(c).

In Embodiment 6, a positive pattern is formed by using a resist not chemically amplified(i.e., ageneral resist) containing a base polymer including polystyrene in which hydroxyl groups are substituted for hydrogen atoms at two or more portions of a benzene ring; and a dissolution inhibiting agent, which decomposes when irradiated with light, for inhibiting solubility of the base polymer in an alkaline developer. The specific composition of the resist material is as follows:

Base polymer:
a polymer represented by Chemical Formula 7 2 g

Dissolution inhibiting agent:
a compound represented by Chemical Formula 8 1.5 g
Solvent: diglyme 20 g Chemical Formula 7:

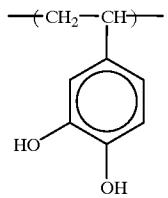

Chemical Formula 8:

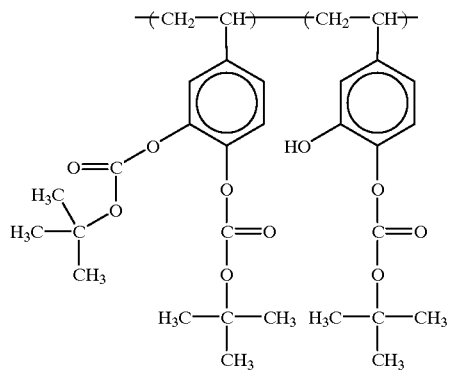

First, as is shown in FIG. 4(a), the resist material having the aforementioned composition is applied by spin coating on a semiconductor substrate 30, thereby forming a resist film 31 with a thickness of 0.3 μm. Although the base polymer is alkali-soluble, the resist film 31 is alkali-refractory due to the function of the dissolution inhibiting agent.

Next, as is shown in FIG. 4(b), the resist film 31 is irradiated with a $F_2$ laser beam 33 with a wavelength of a 157 nm band through a mask 32 for pattern exposure. In this manner, the dissolution inhibiting agent decomposes through irradiation with light, and hence, an exposed portion 31a of the resist film 31 becomes soluble in an alkaline aqueous solution.

Then, the resist film 31 is developed with an alkaline developer, such as a tetramethylammonium hydroxide aqueous solution. Since the exposed portion 31a of the resist film 31 is dissolved in the developer, an unexposed portion 31b of the resist film 31 is formed into a resist pattern 34 as is shown in FIG. 4(c).

In Embodiment 6, since the base polymer of the resist material includes polystyrene in which hydroxyl groups are substituted for hydrogen atoms at two or more portions of a benzene ring, the peak of the light absorption wavelength determined by the benzene ring is largely shifted toward a longer wavelength, and hence, the absorbing property against light of a wavelength of a 1 nm through 180 nm band is decreased. Accordingly, transmittance against the exposing light of a wavelength of a 1 nm through 180 nm band is increased. As a result, the exposing light can sufficiently reach the bottom of the resist film 31, and hence, the resist pattern 34 can be formed in a good sectional shape with a line width of 0.1 μm.

Embodiment 7

A pattern formation method of Embodiment 7 will now be described with reference to FIGS. 6(a) through 6(d).

In Embodiment 7, a positive pattern is formed by using a resist material containing a base polymer including polystyrene in which hydroxyl groups are substituted for hydrogen atoms at two or more portions of a benzene ring. The specific composition of the resist material is as follows:
Base polymer:
a polymer represented by Chemical Formula 9 2 g
Solvent: diglyme 20 g Chemical Formula 9:

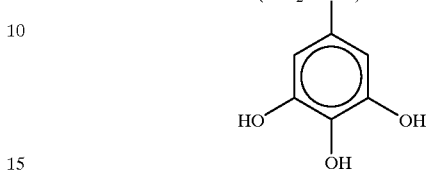

Figure 6A:
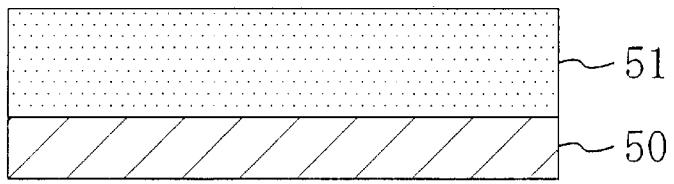
FIGS. 6(a) through 6(d) are sectional views for showing procedures in a pattern formation method of any of Embodiments 7 and 11 of the invention.

First, as is shown in FIG. 6(a), the resist material having the aforementioned composition is applied by spin coating on a semiconductor substrate 50, thereby forming a resist film 51 with a thickness of 0.3 μm.

Figure 6B:
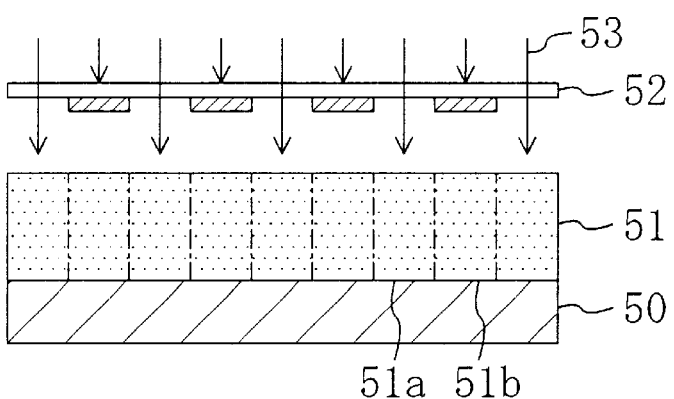

Next, as is shown in FIG. 6(b), the resist film 51 is irradiated with a $F_2$ laser beam 53 with a wavelength of a 157 nm band through a mask 52 for pattern exposure. In this manner, an exposed portion 51a of the resist film 51 becomes difficult to react with an organic metal such as a dimethylsilyl dimethylamine gas.

Figure 6C:
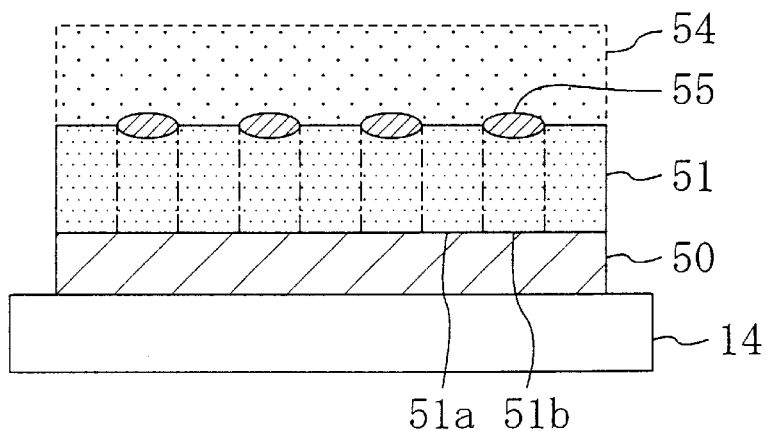

Then, as is shown in FIG. 6(c), a dimethylsilyl dimethylamine gas 54 serving as an organometallization agent is supplied onto the surface of the resist film 51. In this manner, a silylated layer 55 is formed as an organic metal film in the surface of an unexposed portion 51b alone of the resist film 51.

Figure 6D:
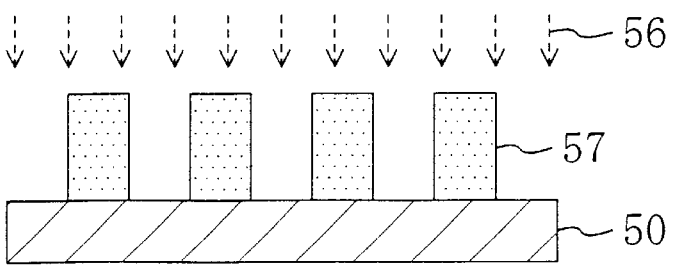

Thereafter, as is shown in FIG. 6(d), the resist film 51 is etched (developed) with oxygen plasma 56 with the silylated layer 55 used as a mask. Since an exposed portion 51a of the resist film 51 is thus removed, the unexposed portion 51b of the resist film 51 is formed into a resist pattern 57.

In Embodiment 7, since the base polymer of the resist material includes polystyrene in which hydroxyl groups are substituted for hydrogen atoms at two or more portions of a benzene ring, the peak of the light absorption wavelength determined by the benzene ring is largely shifted toward a longer wavelength, and hence, the absorbing property against light of a wavelength of a 1 nm through 180 nm band is decreased. Accordingly, transmittance against the exposing light of a wavelength of a 1 nm through 180 nm band is increased. As a result, a blocking layer for organometallization agent is formed from the surface down to a deep site of the exposed portion 51a of the resist film 51, and hence, the organometallization agent can be prevented from diffusing from the unexposed portion 51b to the exposed portion 51a.

Furthermore, since the concentration of hydroxyl groups is high in the resist film 51, the silylated layer 55 formed in the unexposed portion 51b of the resist film 51 attains a high density. This increases the etch selectivity between the exposed portion 51a and the unexposed portion 51b of the resist film 51, thereby realizing high resolution. As a result, the resist pattern 57 can be formed in a good sectional shape with a line width of 0.05 μm in Embodiment 7.

Now, an evaluation test conducted for evaluating the invention will be described. Comparative Example 1 described below is different from Embodiment 7 in the resist material alone, and hence, the resist material alone will be described.

COMPARATIVE EXAMPLE 1

Base polymer: poly(p-hydroxystyrene) 2 g
Solvent: diglyme 20 g

A resist film made from the resist material of Comparative Example 1 is irradiated with a F$_2$ laser beam for pattern exposure, a dimethylsilyl dimethylamine gas is supplied onto the surface thereof, and the resultant resist film is etched with oxygen plasma. As a result, a resist pattern with a line width of 0.1 μm or less cannot be formed because the contrast between an exposed portion and an unexposed portion of the resist film is poor.

Embodiment 8

A pattern formation method of Embodiment 8 will now be described with reference to FIGS. 2(a) through 2(d).

In Embodiment 8, a positive pattern is formed by using a chemically amplified resist containing a base polymer including polystyrene in which at least one of hydroxyl groups substituted for hydrogen atoms at two or more portions of a benzene ring is replaced with a protecting group; and an acid generator for generating an acid through irradiation with light. The specific composition of the resist material is as follows:

Base polymer:
  a polymer represented by Chemical Formula 10 2 g
Acid generator: triphenylsulfonium triflate 0.04 g
Solvent: diglyme 20 g Chemical Formula 10:

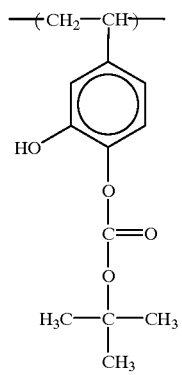

First, as is shown in FIG. 2(a), the resist material having the aforementioned composition is applied by spin coating on a semiconductor substrate 10, thereby forming a resist film 11 with a thickness of 0.3 μm.

Next, as is shown in FIG. 2(b), the resist film 11 is irradiated with a F$_2$ laser beam 13 with a wavelength of a 157 nm band through a mask 12 for pattern exposure. In this manner, an acid is generated from the acid generator in an exposed portion 11a of the resist film 11 while no acid is generated in an unexposed portion 11b of the resist film 11.

Then, as is shown in FIG. 2(c), the semiconductor substrate 10 together with the resist film 11 are heated with a hot plate 14. Although the base polymer is alkali-refractory, it decomposes when heated in the presence of an acid, and hence, the exposed portion 11a of the resist film 11 becomes soluble in an alkaline developer.

Thereafter, the resist film 11 is developed with an alkaline developer, such as a tetramethylammonium hydroxide aqueous solution. Since the exposed portion 11a of the resist film 11 is dissolved in the developer, the unexposed portion 11b of the resist film 11 is formed into a resist pattern 15 as is shown in FIG. 2(d).

In Embodiment 8, since the base polymer of the resist material includes polystyrene in which at least one of hydroxyl groups substituted for hydrogen atoms at two or more portions of a benzene ring is replaced with a protecting group, the peak of the light absorption wavelength determined by the benzene ring is largely shifted toward a longer wavelength, and hence, the absorbing property against light of a wavelength of a 1 nm through 180 nm band is decreased. Accordingly, transmittance against the exposing light of a wavelength of a 1 nm through 180 nm band is increased. As a result, the exposing light can sufficiently reach the bottom of the resist film 11, and hence, the resist pattern 15 can be formed in a good sectional shape with a line width of 0.1 μm.

Embodiment 9

A pattern formation method of Embodiment 9 will now be described with reference o FIGS. 4(a) through 4(c).

In Embodiment 9, a positive pattern is formed by using a resist not chemically amplified (i.e., a general resist) containing a base polymer including polystyrene in which at least one of hydroxyl groups substituted for hydrogen atoms at two or more portions of a benzene ring is replaced with a protecting group. The specific composition of the resist material is as follows:

Base polymer:
  a polymer represented by Chemical Formula 11 2 g
Solvent: diglyme 20 g Chemical Formula 11:

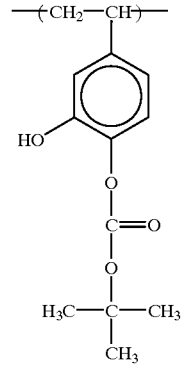

First, as is shown in FIG. 4(a), the resist material having the aforementioned composition is applied by spin coating on a semiconductor substrate 30, thereby forming a resist film 31 with a thickness of 0.3 μm.

Next, as is shown in FIG. 4(b), the resist film 31 is irradiated with a F$_2$ laser beam 33 with a wavelength of a 157 nm band through a mask 32 for pattern exposure. In this manner, although the resist material is alkali-refractory, an exposed portion 31a of the resist film 31 becomes soluble in an alkaline aqueous solution through decomposition while an unexposed portion 31b of the resist film 31 remains alkali-refractory.

Then, the resist film 31 is developed with an alkaline developer. Since the exposed portion 31a of the resist film 31 is dissolved in the developer, the unexposed portion 31b of the resist film 31 is formed into a resist pattern 34 as is shown in FIG. 4(c).

In Embodiment 9, since the base polymer of the resist material includes polystyrene in which at least one of hydroxyl groups substituted for hydrogen atoms at two or more portions of a benzene ring is replaced with a protecting group, the peak of the light absorption wavelength determined by the benzene ring is largely shifted toward a longer wavelength, and hence, the absorbing property against light of a wavelength of a 1 nm through 180 nm band is decreased. Accordingly, transmittance against the exposing light of a wavelength of a 1 nm through 180 nm band is increased. As a result, the exposing light can sufficiently reach the bottom of the resist film 31, and hence, the resist pattern 34 can be formed in a good sectional shape with a line width of 0.1 µm.

Embodiment 10

A pattern formation method of Embodiment 10 will now be described with reference to FIGS. 2(a) through 2(d).

In Embodiment 10, a positive pattern is formed by using a chemically amplified resist containing a base polymer including a copolymer of a compound including polystyrene in which hydroxyl groups are substituted for hydrogen atoms at two or more portions of a benzene ring and a compound in which at least one of hydroxyl groups substituted for hydrogen atoms at two or more portions of a benzene ring is replaced with a protecting group; and an acid generator for generating an acid through irradiation with light. The specific composition of the resist material is as follows:

Base polymer:
a polymer represented by Chemical Formula 12 2 g
Acid generator: triphenylsulfonium triflate 0.04 g
Solvent: diglyme 20 g Chemical Formula 12:

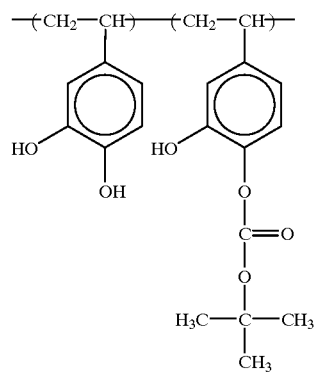

First, as is shown in FIG. 2(a), the resist material having the aforementioned composition is applied by spin coating on a semiconductor substrate 10, thereby forming a resist film 11 with a thickness of 0.3 µm.

Next, as is shown in FIG. 2(b), the resist film 11 is irradiated with a $F_2$ laser beam 13 with a wavelength of a 157 nm band through a mask 12 for pattern exposure. In this manner, an acid is generated from the acid generator in an exposed portion 11a of the resist film 11 while no acid is generated in an unexposed portion 11b of the resist film 11.

Then, the semiconductor substrate 10 is heated with a hot plate 14 as is shown in FIG. 2(c). Although the base polymer is alkali-refractory, it decomposes when heated in the presence of an acid, and hence, the exposed portion 11a of the resist film 11 becomes soluble in an alkaline developer.

Thereafter, the resist film 11 is developed with an alkaline developer, such as a tetramethylammonium hydroxide aqueous solution. Since the exposed portion 11a of the resist film 11 is dissolved in the developer, the unexposed portion 11b of the resist film 11 is formed into a resist pattern 15 as is shown in FIG. 2(d).

In Embodiment 10, since the base polymer of the resist material includes the copolymer of the compound including polystyrene in which hydroxyl groups are substituted for hydrogen atoms at two or more portions of a benzene ring and the compound in which at least one of hydroxyl groups substituted for hydrogen atoms at two or more portions of a benzene ring is replaced with a protecting group, the peak of the light absorption wavelength determined by the benzene rings is largely shifted toward a longer wavelength, and hence, the absorbing property against light of a wavelength of a 1 nm through 180 nm band is decreased. Accordingly, transmittance against the exposing light of a wavelength of a 1 nm through 180 nm band is increased. As a result, the exposing light can sufficiently reach the bottom of the resist film 11, and hence, the resist pattern 15 can be formed in a good sectional shape with a line width of 0.1 µm.

Now, an evaluation test conducted for evaluating the invention will be described. Comparative Example 2describe below is different from Embodiment 10 in the resist material alone, and hence, the resist material alone will be described.

COMPARATIVE EXAMPLE 2

Base polymer:

a polymer represented by Chemical Formula 13 2 g

Acid generator: triphenylsulfonium triflate 0.04 g

Solvent: diglyme 20 g

Chemical Formula 13:

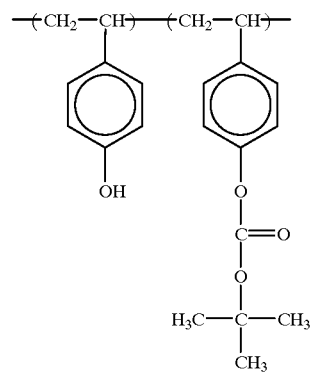

A resist film made from the resist material of Comparative Example 2 is irradiated with a $F_2$ laser beam for pattern exposure and then developed with a tetramethylammonium hydroxide aqueous solution. As a result, a resist pattern cannot be formed in a good pattern shape.

Embodiment 11

A pattern formation method of Embodiment 11 will now be described with reference to FIGS. 6(a) through 6(d).

In Embodiment 11, a positive pattern is formed by using a resist material containing a base polymer including a copolymer of a compound including polystyrene in which hydroxyl groups are substituted for hydrogen atoms at two or more portions of a benzene ring and a compound in which at least one of hydroxyl groups substituted for hydrogen atoms at two or more portions of a benzene ring is replaced with a protecting group. The specific composition of the resist material is as follows:

Base polymer:
a polymer represented by Chemical Formula 14 2 g
Solvent: diglyme 20 g Chemical Formula 14:

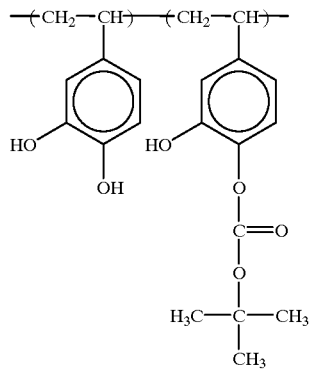

First, as is shown in FIG. 6(a), the resist material having the aforementioned composition is applied by spin coating on a semiconductor substrate 50, thereby forming a resist film 51 with a thickness of 0.3 μm.

Next, as is shown in FIG. 6(b), the resist film 51 is irradiated with a $F_2$ laser beam 53 with a wavelength of a 157 nm band through a mask 52 for pattern exposure. Then, a dimethylsilyl dimethylamine gas 54 is supplied onto the surface of the resist film 51 as is shown in FIG. 6(c), so as to form a silylated layer 55 in a surface region of an unexposed portion 51b of the resist film 51.

Thereafter, as is shown in FIG. 6(d), the resist film 51 is etched (developed) with oxygen plasma 56 with the silylated layer 55 used as a mask. Since an exposed portion 51a of the resist film 51 is thus removed, the unexposed portion 51b of the resist film 51 is formed into a resist pattern 57.

In Embodiment 11, since the base polymer of the resist material includes the copolymer of the compound including polystyrene in which hydroxyl groups are substituted for hydrogen atoms at two or more portions of a benzene ring and the compound in which at least one of hydroxyl groups substituted for hydrogen atoms at two or more portions of a benzene ring is replaced with a protecting group, the peak of the light absorption wavelength determined by the benzene rings is largely shifted toward a longer wavelength, and hence, the absorbing property against light of a wavelength of a 1 nm through 180 nm band is decreased. Accordingly, transmittance against the exposing light of a wavelength of a 1 nm through 180 nm band is increased. As a result, an organic metal blocking layer is formed from the surface down to a deep site of the exposed portion 51a of the resist film 51, and hence, the organometallization agent can be prevented from diffusing from the unexposed portion 51b to the exposed portion 51a.

Furthermore, since the concentration of hydroxyl groups is high in the resist film 51, the silylated layer 55 formed in the unexposed portion 51b of the resist film 51 attains a high density. This increases the etch selectivity between the exposed portion 51a and the unexposed portion 51b of the resist film 51, thereby realizing high resolution. As a result, the resist pattern 57 can be formed in a good sectional shape with a line width of 0.05 μm in Embodiment 11.

What is claimed is:

1. A pattern formation method comprising the steps of:
    forming a resist film by applying, on a substrate, a resist material containing a base polymer including polystyrene in which hydroxyl groups are substituted for hydrogen atoms at two or more portions of a benzene ring; and
    forming a resist pattern by irradiating said resist film with exposing light, wherein said exposing light is selected from the group consisting of $F_2$ laser beam, $Kr_2$ laser beam, ArKr laser beam, and $Ar_2$ laser beam for pattern exposure and developing said resist film with a developer after the pattern exposure.

2. The pattern formation method of claim 1,
    wherein solubility of said base polymer in said developer changes in the presence of an acid, and
    said resist material further contains an acid generator for generating an acid through irradiation with said exposing light.

3. The pattern formation method of claim 1,
    wherein said base polymer is soluble in said developer, and
    said resist material further contains a crosslinking agent for making said base polymer refractory in said developer by causing crosslinkage of said base polymer through irradiation with said exposing light.

4. The pattern formation method of claim 1,
    wherein said base polymer is soluble in said developer, and
    said resist material further contains a dissolution inhibiting agent that inhibits solubility of said base polymer in said developer and decomposes through irradiation with said exposing light.

5. The pattern formation method of claim 4,
    wherein said dissolution inhibiting agent is a compound in which at least one of hydroxyl groups substituted for hydrogen atoms at two or more portions of a benzene ring of polystyrene is replaced with a protecting group.

6. A pattern formation method comprising the steps of:
    forming a resist film by applying, on a substrate, a resist material containing a base polymer including polystyrene in which at least one of hydroxyl groups substituted for hydrogen atoms at two or more portions of a benzene ring is replaced with a protecting group; and
    forming a resist pattern by irradiating said resist film with exposing light, wherein said exposing light is selected from the group consisting of $F_2$ laser beam, $Kr_2$ laser beam, ArKr laser beam, and $Ar_2$ laser beam for pattern exposure and developing said resist with a developer after the pattern exposure.

7. The pattern formation method of claim 6,
    wherein solubility of said base polymer in said developer changes in the presence of an acid, and
    said resist film further contains an acid generator for generating an acid through irradiation with said exposing light.

8. A pattern formation method comprising the steps of:
    forming a resist film by applying, on a substrate, a resist material containing a copolymer of a compound including polystyrene in which hydroxyl groups are substituted for hydrogen atoms at two or more portions of a benzene ring and a compound in which at least one of hydroxyl groups substituted for hydrogen atoms at two or more portions of a benzene ring is replaced with a protecting group; and
    forming a resist pattern by irradiating said resist film with exposing light, wherein said exposing light is selected from the group consisting of $F_2$ laser beam, $Kr_2$ laser beam, ArKr laser beam, and $Ar_2$ laser beam for pattern exposure and developing said resist film with a developer after the pattern exposure.

9. The pattern formation method of claim 8, wherein solubility of said base polymer in said developer changes in the presence of an acid, and said resist material further contains an acid generator for generating an acid through irradiation with said exposing light.

10. A pattern formation method comprising the steps of:

forming a resist film by applying, on a substrate, a resist material containing a base polymer including polystyrene in which hydroxyl groups are substituted for hydrogen atoms at two or more portions of a benzene ring;

irradiating said resist film with exposing light, wherein said exposing light is selected from the group consisting of $F_2$ laser beam, $Kr_2$ laser beam, ArKr laser beam, and $Ar_2$ laser beam for pattern exposure and forming an organic metal film in a surface region of an unexposed portion of said resist film after the pattern exposure; and forming a resist pattern from said unexposed portion of said resist film by etching said resist film with said organic metal film used as a mask.

* * * * *

UNITED STATES PATENT AND TRADEMARK OFFICE
CERTIFICATE OF CORRECTION

PATENT NO.    : 6,475,706 B1
DATED         : November 5, 2002
INVENTOR(S)   : Shinji Kishimura et al.

It is certified that error appears in the above-identified patent and that said Letters Patent is hereby corrected as shown below:

<u>Column 18,</u>
Line 45, add -- film -- after the word "resist"

Signed and Sealed this

Eighteenth Day of February, 2003

JAMES E. ROGAN
*Director of the United States Patent and Trademark Office*